(12) United States Patent  
Bijvoet

(10) Patent No.: US 7,151,591 B2
(45) Date of Patent: Dec. 19, 2006

(54) ALIGNMENT SYSTEM, ALIGNMENT METHOD, AND LITHOGRAPHIC APPARATUS

(75) Inventor: Dirk-Jan Bijvoet, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 90 days.

(21) Appl. No.: 10/950,668

(22) Filed: Sep. 28, 2004

(65) Prior Publication Data

US 2006/0066827 A1 Mar. 30, 2006

(51) Int. Cl.
*G03B 27/42* (2006.01)

(52) U.S. Cl. .......................................... 355/53; 355/72
(58) Field of Classification Search ................... None
See application file for complete search history.

(56) References Cited

U.S. PATENT DOCUMENTS

| 4,307,961 | A | * | 12/1981 | Blitchington et al. ....... 356/400 |
| 4,958,982 | A | * | 9/1990 | Champet et al. .......... 414/751.1 |
| 5,798,651 | A | * | 8/1998 | Aruga et al. ................ 324/754 |
| 5,883,703 | A | * | 3/1999 | Knirck et al. .................. 355/55 |
| 6,098,484 | A | * | 8/2000 | Bacchi et al. ............. 74/490.03 |
| 6,659,116 | B1 | * | 12/2003 | Williams et al. ............. 134/176 |

FOREIGN PATENT DOCUMENTS

JP 2003243473 * 8/2003

\* cited by examiner

*Primary Examiner*—D. Rutledge
(74) *Attorney, Agent, or Firm*—Pillsbury Winthrop Shaw Pittman, LLP

(57) ABSTRACT

A system and a method for aligning two devices with respect to each other are presented. A first device is provided with a proximity switch and the second device is provided with a reference mark. When the second device enters a detection area of the proximity switch, a first state of the proximity switch changes to a second state, thus indicating a position of the second device with respect to the proximity switch. When the position of the second device is known with respect to the proximity switch, the devices may be positioned to a desired position with respect to each other. The proximity switch may be used to determine the position of the other device in a number of directions. Both the position and the orientation of the first device with respect to the second device may be determined using the proximity switch.

29 Claims, 2 Drawing Sheets

ALIGNMENT SYSTEM, ALIGNMENT METHOD, AND LITHOGRAPHIC APPARATUS

BACKGROUND

1. Field of the Invention

The present invention relates to a lithographic apparatus, an alignment system and an alignment method.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned.

Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Generally, a number of systems and/or objects are aligned before performing certain steps of a lithographic device manufacturing method. For example, the patterning device, the substrate and the projection beam should be aligned correctly while the pattern is being imaged. Also, other devices should be aligned and/or alignment of a number of devices may be desirable during these and other steps of the lithographic method.

To align objects, an alignment system may be provided. In conventional lithographic apparatus, a docking principle is employed to mechanically align two or more devices. In the docking method, a first device is moved towards a second device. When the first device arrives near the second device, the first device mechanically engages the second device at a number of predetermined positions. Due to the engagement, the relative position of the first device is known with respect to the second device. Depending on a number of characteristics (e.g. the shape of the first and second devices at the engaging locations, the movement of the first device, and/or possibly other characteristics) the relative positioning, i.e. the alignment, of the two devices has a predetermined accuracy.

The alignment method using the docking principle may be performed in combination with other alignment methods. For example, it may be possible to align a device in a first direction using a proximity switch. Then, the device may be aligned in a second and further direction using the docking principle described above.

The first device may be connected to an actuator configured to move the first device with a wrist assembly. Such a wrist assembly provides a flexible coupling between the first device and the actuator, which, among other things, provides flexibility for calibration and alignment purposes.

However, a wrist assembly is a complex structure requiring high manufacturing costs.

SUMMARY

It is desirable to have an alignment device and alignment method for aligning at least two devices of a lithographic apparatus with respect to each other in an improved manner.

According to an embodiment of the invention, there is provided a lithographic apparatus including an illumination system configured to condition a radiation beam; a pattern support constructed to support a patterning device, the patterning device being capable of imparting the radiation beam with a pattern in its cross-section to form a patterned radiation beam; a substrate table constructed to hold a substrate; and a projection system configured to project the patterned radiation beam onto a target portion of the substrate, wherein the apparatus is further provided with an alignment system for aligning at least two devices with respect to each other, the alignment system including at least one proximity switch, a control system operatively connected to the proximity switch for receiving a detection state of said proximity switch, and at least one actuator operatively connected to the control system for moving one of the at least two devices with respect to at least one other device, the alignment system being configured to determine a position of the at least one of the devices with respect to the at least one other device in at least two directions.

A lithographic apparatus in accordance with an embodiment of the invention includes an illumination system configured to condition a radiation beam, a pattern support configured to support a patterning device, the patterning device being capable of imparting the radiation beam with a pattern in its cross-section to form a patterned radiation beam, a substrate table configured to hold a substrate, a projection system configured to project the patterned radiation beam onto a target portion of the substrate, and an alignment system configured to align two devices with respect to each other, the alignment system including a proximity switch, a control system operatively connected to the proximity switch and configured to receive a detection state of the proximity switch, and at least one actuator operatively connected to the control system and configured to move a first of the two devices relative to a second of the two devices, wherein the alignment system is configured to determine a position of the first device relative to the second of the two devices in at least two directions.

According to another embodiment of the invention, there is provided an alignment system for aligning at least two devices with respect to each other in at least two directions, the alignment system including at least one proximity switch, a control system operatively connected to the proximity switch for receiving a detection state of the proximity switch, and at least one actuator operatively connected to the control system for moving at least one of the at least two devices with respect to at least one other device, the alignment system being configured to determine a position of the at least one of the devices with respect to the at least one other device in at least two directions.

An alignment system configured to align two devices with respect to each other in at least two directions, in accordance with an embodiment of the invention, includes a proximity switch, a control system operatively connected to the proximity switch and configured to receive a detection state of the proximity switch, and at least one actuator operatively connected to the control system and configured to move a first of the two devices relative to the second of the two devices, wherein the alignment system is configured to determine a position of the first device relative to the second of the two devices in at least two directions.

According to an embodiment of the invention, there is provided a method for aligning at least two devices with respect to each other in at least two directions, at least one of the devices being provided with a proximity switch, the method including detecting at least one other device using the proximity switch, thereby determining a position of at least one of an edge and an outer surface of the at least one other device with respect to the proximity switch; and determining a position of the at least one other device with respect to the proximity switch from the position of at least one of the edge and the outer surface.

In another embodiment of the invention, there is provided a method for aligning two devices with respect to each other in at least two directions, a first of the two devices being provided with a proximity switch, the method including detecting an edge or an outer surface of a second of the two devices using the proximity switch; determining a position of the edge or the outer surface with respect to the proximity switch based on the detecting; and determining a position of the second of the two devices with respect to the proximity switch from the position of the edge or the outer surface.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
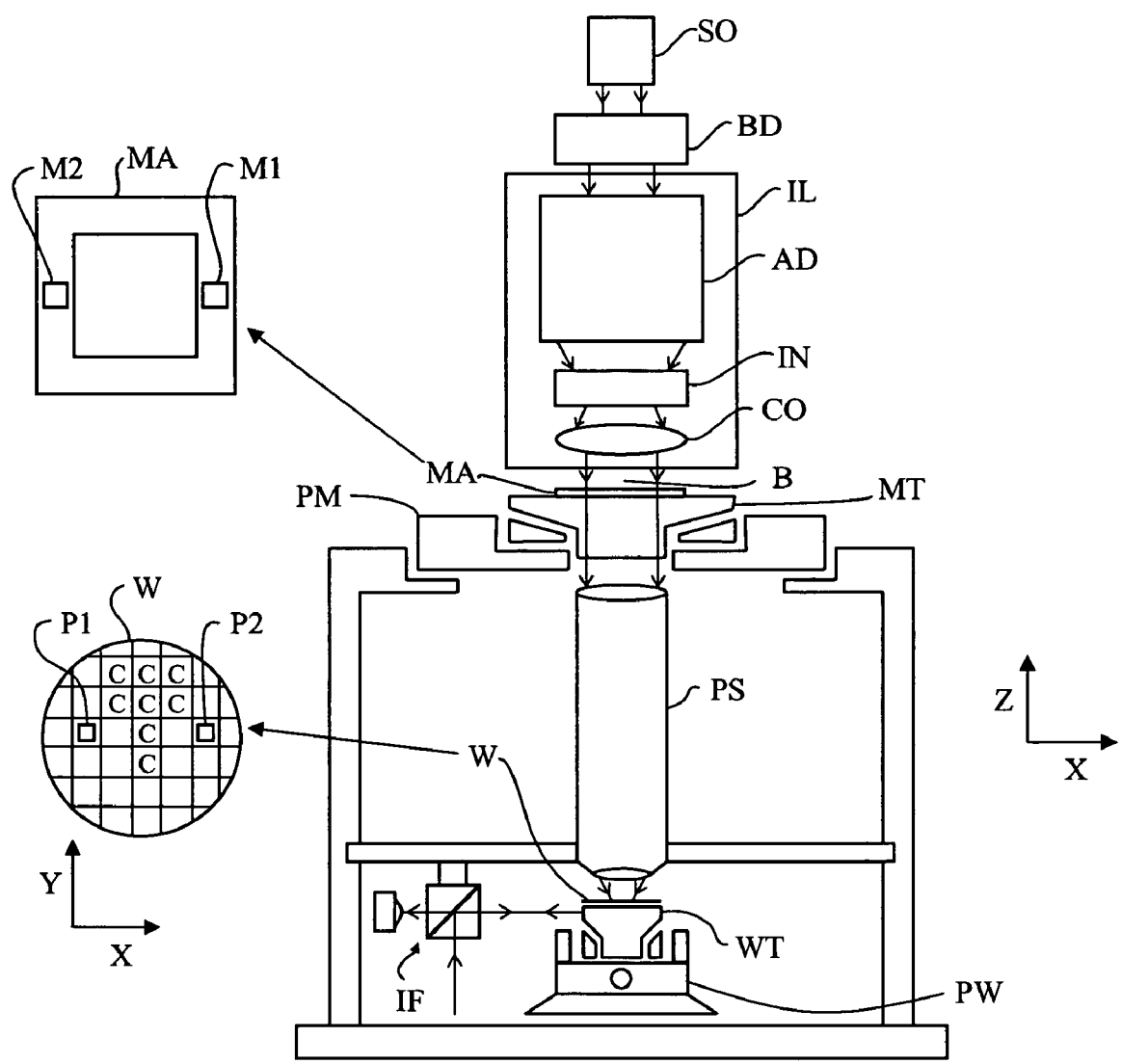
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation) and a support structure (e.g. a mask table) MT configured to support a patterning device (e.g. a mask) MA and connected to a first positioning device PM configured to accurately position the patterning device in accordance with certain parameters. The apparatus further includes a substrate table (e.g. a wafer table) WT configured to hold a substrate (e.g. a resist-coated wafer) W and connected to a second positioning device PW configured to accurately position the substrate in accordance with certain parameters, and a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT may be realized using a long-stroke module and a short-stroke module, which form part of the second positioning device PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

Step mode: the mask table MT and the substrate table WT are kept essentially stationary, while an entire pattern imparted to the radiation beam is projected onto a target portion C at once (i.e. a single static exposure). The substrate table WT is then shifted in the X and/or Y direction so that a different target portion C can be exposed. In step mode, the maximum size of the exposure field limits the size of the target portion C imaged in a single static exposure.

Scan mode: the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

Another mode: the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above-described modes of use or entirely different modes of use may also be employed.

Figure 2:
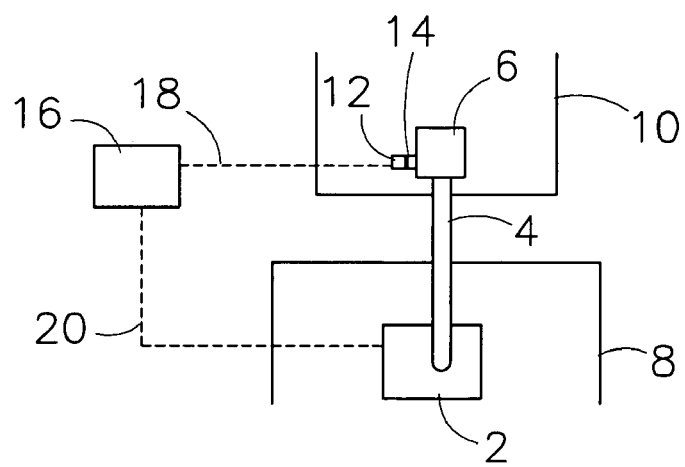
FIG. 2 shows a schematic top view of a robot configured to unload a substrate from a substrate table in accordance with an embodiment of the invention.

FIG. 2 illustrates a robot 2 having a robot arm 4 and a pad 6 connected to robot arm 4. The robot 2 is mounted on a frame 8. The frame 8 may be, for example, a frame of a transfer apparatus configured to transfer a substrate to and/or from a substrate table 10. The substrate table 10 may be positioned with respect to a projection system for projecting a pattern onto the substrate.

It should be understood that the embodiment of the invention shown in FIG. 2 is only an exemplary embodiment. It will be appreciated that the present invention is not limited to a robot configured to transfer a substrate from a substrate table to a transfer apparatus, as shown in FIG. 2. The present invention may as well be employed for positioning any device, such as the pad 6, with respect to any other device, such as the substrate or substrate table 10, with any positioning device, such as the robot 2.

In an embodiment of the invention, the robot 2 is configured to unload a substrate from the substrate table 10, for example after a pattern has been imaged on the substrate. Thereto, the robot 2 captures the substrate such that the pad 6 carries the substrate. Then, the robot 2 rotates and/or withdraws the robot arm 4 to transfer the substrate towards, for example, a transfer apparatus. In order to have a stable pick up and to transfer the substrate to a position with a predetermined accuracy at the transfer apparatus, it is desirable to know the position of the pad 6 with respect to the position of the substrate, i.e. they should be aligned before the substrate is picked up.

In a conventional apparatus, the pad 6 may be aligned with respect to the substrate table 10, since the position of the substrate is known with respect to the substrate table 10. Therefore, when the position of the pad 6 is known with respect to the substrate table 10, its position is also known with respect to the substrate, as required.

In a conventional lithographic apparatus, a proximity switch 12 is provided, which switch 12 is configured to calibrate the relative position of the pad 6 and the substrate table 10 as seen in a vertical direction (perpendicular to the plane of the drawing). The proximity switch 12 may be mounted on the pad 6 or on the substrate table 10. Thereafter, the pad 6 is aligned with the substrate table 10 in a plane substantially perpendicular with respect to the vertical direction using the docking principle as described above. It is, however, noted that the proximity switch 12 may as well be configured to calibrate the position of the pad 6 in any other direction and the alignment plane does not need to be substantially perpendicular with respect to the direction.

The docking principle, i.e. mechanically engaging two devices at predetermined locations such that their positions are known with respect to each other, requires complex and relatively expensive devices and is time consuming. According to an embodiment of the present invention, the alignment in the plane may as well be performed using the already present proximity switch 12, thereby obviating the need for the complex and expensive devices and requiring less time, thus increasing the throughput of the lithographic apparatus.

The proximity switch 12 detects an approaching device such as the pad 6. When the approaching device enters a detection area of the proximity switch 12, a detection state of the proximity switch 12 changes from a first state to a second state. Thus, the transition of the proximity switch 12 from the first to the second state, and vice versa, is a measure of a position of an edge or outer surface of the approaching device, since the transition is a detection of the device when entering the detection area. When the device leaves the detection area, the proximity switch 12 changes from the second state to the first state again, thereby again detecting a position of an edge or outer surface of the device moving away from the proximity switch 12. Hereinafter, when there is referred to an edge of a device or a reference mark, this may as well be an outer surface of the device or reference mark.

In an embodiment of the invention, the switch 12 may be an inductive sensor detecting any approaching metal object. In another embodiment of the invention, the proximity switch 12 may be an optical sensor detecting any approaching object, and the proximity switch 12 may also be a mechanical or any other kind of switch, although contact-free sensors may be desirable.

In FIG. 2, a control system 16 is operatively connected via a connection indicated by a dashed line 18 to the proximity switch 12 for receiving the detection state of the proximity switch 12. Based on the detection state of the proximity switch 12, the control system 16 controls the robot 2 via a connection indicated by a dashed line 20 to move the pad 6 with respect to the proximity switch 12. Thus, the control system 16 may determine a position of the pad 6 relative to the position of the proximity switch 12 and align the pad 6 with respect to the proximity switch 12 or any other device having a known relative position with respect to the proximity switch 12.

In an embodiment of the invention, a reference mark 14 may be provided. The reference mark 14 is configured to align a device, to which the reference mark 14 is attached, in one or more directions. In an embodiment of the invention, the reference mark 14 has at least one edge or outer surface perpendicular to each alignment direction. In another embodiment of the invention, two parallel edges or plane-parallel outer surfaces are provided for each alignment direction, since two parallel edges or plane-parallel outer surfaces enable to cancel any systematic measurement error, as is described in more detail below. It will be appreciated that the use of a reference mark 14 does not require that the device be provided with an edge, or suitable outer surface, designed to align the device. Furthermore, it will be appreciated that the use of a reference mark 14 enables one to have the alignment edges close to each other, which decreases the time needed for alignment and thus increases the throughput of the apparatus.

It will be appreciated that the proximity switch 12 and the reference mark 14 may be positioned on any side of the pad 6 or on the substrate table 10. In the embodiment of the invention illustrated in FIG. 2, the position of the reference mark 14 is arranged on a side of the pad 6. In other embodiments of the invention, the reference mark 14 may be positioned on any side or it may as well be positioned above or under the pad 6. The position of the mark 14 and the proximity switch 12 are arranged in cooperative relationship such that the proximity switch 12 may detect the reference mark 14. Although the reference mark 14 and the proximity switch 12 have been respectively arranged on the pad 6 and the substrate table 10 in FIG. 2, it will be appreciated that alternative arrangements may be done in other embodiments of the invention. For example, the proximity switch 12 may be arranged on pad 6 while the proximity mark 14 may be arranged on the substrate table 10.

As soon as a position of the pad 6 with respect to the substrate table 10 is determined in a first direction, for example the vertical direction, using the proximity switch 12, the pad 6 may be aligned with respect to the substrate table 10 in the first direction, i.e. its position may be changed in order to correspond to a desired position in the first direction. However, for alignment in other directions, a position in the other directions may also be determined prior to performing the alignment in the first direction.

The determination of the position in other directions may be performed according to the present invention using the same proximity switch 12. Thereto, the pad 6 or the substrate table 10 is provided with a reference mark 14. If the proximity switch 12 is an optical switch or system, the reference mark 14 may be a colored image, which image, or the edges thereof, may be detected by the proximity switch 12. If the proximity switch 12 is an inductive sensor, the reference mark 14 may be an elevated or lowered part of the pad 6, or even a hole in the pad 6. The shape of the reference mark 14 may be selected depending on the configuration, a desired measurement accuracy and/or other requirements.

Figure 3:
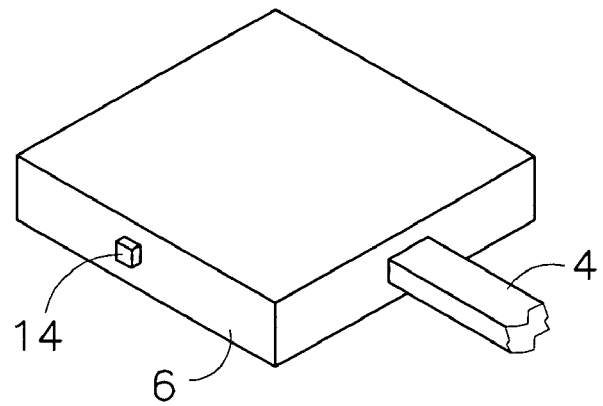
FIG. 3 shows a perspective view of a reference mark present on a pad connected to the robot arm of FIG. 2.

FIG. 3 illustrates a reference mark 14 with a rectangular shape. The mark 14 is configured such that its edges may be detected by a suitable proximity switch. For example, the reference mark 14 may be arranged at an elevated (as shown in FIG. 3) or a lowered part of the robot arm 4 or the pad 6 connected thereto. In an embodiment of the invention, the proximity switch may be an optical sensor detecting the edge, or the proximity switch may be an inductive sensor, if the reference mark 14 is made of metal. Detection of a predetermined edge of the reference mark 14 enables determination of the position of the structure such as the pad and/or the robot arm, since the position is predetermined with respect to the edge. Multiple detections may be employed to increase the accuracy of the measurement.

Figure 4:
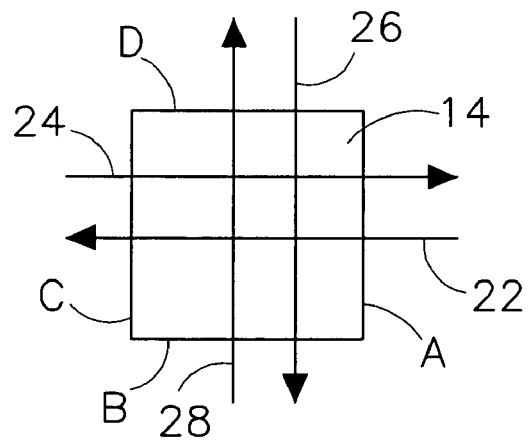
FIG. 4 shows the directions of movement of the reference mark during determination of the reference mark position in accordance with an embodiment of the invention.

FIG. 4 is a schematic representation of a rectangular reference mark 14 in accordance with an embodiment of the invention. In FIG. 4, arrows 22, 24, 26, and 28 illustrate the directions of movement of the reference mark 14 during determination of the reference mark position using a proximity switch in accordance with an embodiment of the invention. The proximity switch is configured to detect an edge or outer surface of the reference mark 14. The edges of the reference mark 14 are indicated with A, B, C and D.

In a first detection step, the reference mark 14 moves in the direction of the first arrow 22 with respect to the proximity switch. It will be appreciated that, relative to a point in space, the reference mark 14 may move, the proximity switch may move, or both may move. During this first step, edges A and C of the reference mark 14 are detected. Each edge A, C is detected with a measurement error, which error includes a systematic error and a statistic error. The systematic error occurs with each detection, and has a constant value. The statistic error reoccurs with a random value.

In a next step, the reference mark 14 moves in the direction of the second arrow 24 with respect to the proximity switch. It will be appreciated that detections in the directions of arrows 22, 24, 26, and 28 may be performed in any order. The order is not important for the results of the described method. Now, in the direction of the second arrow 24, the edges C and A are detected. However, the systematic error present in this detection has an opposite value with respect to the detections of the edges A and C in the first detection step in the direction of the first arrow 22. Thus, averaging the detection values of the position of the edges A and C (four values in total, two of edge A and two of edge C) cancels the systematic error and results in a position of a center of the reference mark 14 between the two edges A and C. Thus, a center position of the mark 14 may be found along one line parallel to the directions indicated by arrows 22, 24.

In a third and fourth step, the same method is applied along a second line, which can be perpendicular to the first line in an embodiment of the invention. The second line is parallel to the third and fourth arrow 26, 28. Thus, the proximity switch is employed to determine the position of the reference mark 14, and the structure to which it is connected, in a plane, which plane is defined by the first and the second line parallel to the first and second arrows and the third and fourth arrows, respectively.

Figure 5:
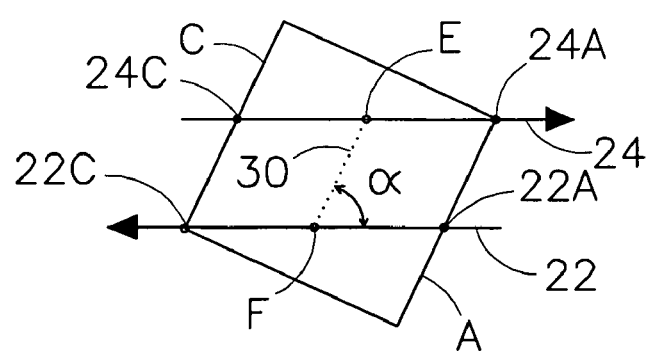
FIG. 5 shows the directions of movement of the reference mark during determination of the reference mark position in accordance with an embodiment of the invention.

It will be appreciated that the method described above may easily be extended to more directions. For example, a rotation around one or more of the lines, i.e. directions, may as well be determined. An exemplary rotation determination method is illustrated in FIG. 5. A reference mark 14 is rotated with respect to the first direction parallel to the first and the second arrows 22, 24. The position of at least two substantially parallel edges A, C of the reference mark 14 is determined at two positions along each of the edges A, C indicated by reference numerals 22A, 22C, 24A, 24C. A position of a center E, F of the reference mark 14 may be determined along each arrow 24, 22, respectively. An angle α determines the rotation of the reference mark 14 with respect to the first direction, which angle α may be determined as an angle between the first direction parallel to the arrows 22, 24 and an imaginary line 30 between the centers E, F. The accuracy of such a rotation determination method is limited by the distance between the first and second edge 22, 24. To obtain a rotation angle with a possibly higher accuracy, the device provided with a reference mark may be further provided with a second reference mark. By determining the position of the first and the second reference mark, the rotation may be determined. In this case, the distance between the first and second reference mark determines the accuracy of the rotation determination method.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5–20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
   an illumination system configured to condition a radiation beam;
   a pattern support configured to support a patterning device, the patterning device being capable of imparting the radiation beam with a pattern in its cross-section to form a patterned radiation beam;
   a substrate table configured to hold a substrate;
   a projection system configured to project the patterned radiation beam onto a target portion of the substrate,
   an alignment system configured to align two devices with respect to each other, the alignment system comprising
   a proximity switch,
   a control system operatively connected to the proximity switch and configured to receive a detection state of said proximity switch, and at least one actuator operatively connected to said control system and configured to move a first of said two devices relative to a second of said two devices, wherein the alignment system is configured to determine a position of said first device relative to said second of said two devices in at least two directions with said proximity switch.

2. The lithographic apparatus of claim 1, wherein said first device is a metal object and the proximity switch is an inductive sensor configured to detect a movement of said metal object.

3. The lithographic apparatus of claim 1, wherein said first device is provided with a reference mark.

4. The lithographic apparatus of claim 3, wherein said reference mark is a hole selectively formed in said first device.

5. The lithographic apparatus of claim 3, wherein said reference mark is an elevation selectively formed in said first device.

6. The lithographic apparatus of claim 3, wherein said reference mark is a rectangle.

7. The lithographic apparatus of claim 1, wherein said proximity switch is an optical sensor.

8. The lithographic apparatus of claim 1, wherein said proximity switch is arranged on the second device.

9. The lithographic apparatus of claim 1, wherein said first device is a pad of a robot and the second device is the substrate table or the pattern support.

10. The lithographic apparatus of claim 1, further comprising at least one additional device, and wherein said alignment system determines a position of said first device relative to said at least one additional device.

11. The lithographic apparatus of claim 1, wherein the actuator moves the first device and wherein the second of said two devices is stationary.

12. The lithographic apparatus of claim 1, wherein the first and second devices both move.

13. An alignment system configured to align two devices with respect to each other in at least two directions, the alignment system comprising:
a proximity switch,
a control system operatively connected to said proximity switch and configured to receive a detection state of said proximity switch, and
at least one actuator operatively connected to said control system and configured to move a first of said two devices relative to a second of said two devices,
wherein the alignment system is configured to determine a position of said first device relative to the second of said two devices in at least two directions with said proximity switch.

14. The alignment system of claim 13, wherein said proximity switch is an optical sensor.

15. The alignment system of claim 13, wherein said proximity switch is arranged on said second device.

16. The alignment system of claim 13, wherein said first device is a pad of a robot and said second device is the substrate table or the pattern support.

17. The alignment system of claim 13, further comprising at least one additional device, and wherein said alignment system determines a position of said first device relative to said at least one additional device.

18. The alignment system of claim 13, wherein the actuator moves the first device and wherein the second of said two devices is stationary.

19. The alignment system of claim 13, wherein the first and second devices both move.

20. A method for aligning two devices with respect to each other in at least two directions, a first of said two devices being provided with a proximity switch, the method comprising:
detecting an edge or an outer surface of a second of said two devices using said proximity switch;
determining a position of said edge or said outer surface with respect to said proximity switch based on said detecting;
determining a position of the second of said two devices with respect to said proximity switch from the position of said edge or said outer surface, and
detecting a second edge or a second outer surface of the second of said two devices using said proximity switch, said second edge or said second outer surface being different from said edge or said outer surface.

21. The method of claim 20, wherein said edge or said outer surface is an edge or outer surface of a reference mark provided on the second of said two devices.

22. The method of claim 20, wherein a position of at least two substantially parallel edges is determined.

23. The method of claim 20, wherein a position of at least two substantially plane-parallel outer surfaces is determined.

24. The method of claim 20, wherein a position of at least one of said edge and said outer surface is determined at at least two different locations.

25. The method of claim 21, wherein said second of said two devices is provided with a second reference mark, the method further comprising determining a position of an edge or outer surface of said second reference mark.

26. The method of claim 20, further comprising determining a position of said first device relative to at least one additional device.

27. The method of claim 20, wherein the actuator moves the first device and wherein the second of said two devices is stationary.

28. The method of claim 20, wherein the first and second devices both move.

29. A lithographic apparatus comprising:
an illumination system configured to condition a radiation beam;
a pattern support configured to support a patterning device, the patterning device being capable of imparting the radiation beam with a pattern in its cross-section to form a patterned radiation beam;
a substrate support configured to hold a substrate;
a projection system configured to project the patterned radiation beam onto a target portion of the substrate,
an alignment system configured to align two devices with respect to each other, the alignment system comprising:
a proximity switch,
a control system operatively connected to the proximity switch and configured to receive a detection state of said proximity switch, and
at least one actuator operatively connected to said control system and configured to move a first of said two devices relative to a second of said two devices,
wherein the alignment system is configured to determine a position of said first device relative to said second of said two devices in at least two directions, and
wherein said first device is a pad of a robot or one of the supports and the second device is the other of the robot or the one of the supports.

* * * * *